United States Patent [19]

Sund

[11] Patent Number: 5,711,473
[45] Date of Patent: Jan. 27, 1998

[54] INERT ATMOSPHERE SOLDERING APPARATUS

[76] Inventor: William Sund, 8 Amos Crescent, Downsview, Ontario, Canada, M3H 3X9

[21] Appl. No.: 577,308

[22] Filed: Dec. 22, 1995

[51] Int. Cl.$^6$ .................. B23K 1/08; H05K 3/34
[52] U.S. Cl. .................. 228/180.1; 228/232; 228/259
[58] Field of Search .............. 228/180.1, 180.21, 228/219, 232, 234.1, 259, 20.1, 42

[56] References Cited

U.S. PATENT DOCUMENTS

| | | | |
|---|---|---|---|
| 2,671,264 | 3/1954 | Pessel | 228/259 |
| 3,386,166 | 6/1968 | Tardoskegyi | 228/232 |
| 3,828,419 | 8/1974 | Wanner | 228/259 |
| 4,311,266 | 1/1992 | Kondo | 228/259 |
| 4,606,493 | 8/1986 | Christoph et al. | 228/232 |

FOREIGN PATENT DOCUMENTS 59-206155  11/1984  Japan .................. 228/259

*Primary Examiner*—Samuel M. Heinrich
*Attorney, Agent, or Firm*—McConnell and Fox

[57] ABSTRACT

An inert atmosphere spot soldering process and apparatus uses cups arranged to match the arrangement of the terminals to be soldered. The cups are filled to over flowing with liquid solder and provided with a enveloping flow of hot inert gas. The terminals and their surrounding area are exposed to the hot inert gas for a period sufficient to drive off substantially all volatile liquids and the terminals are then immersed in the solder. After immersion, the terminals are raised gently non parallel to the solder surface until they are above the solder and then the flow of inert gas is terminated permitting the solder to solidify. The inert gas may be heated by thermal conduction from the liquid solder.

8 Claims, 6 Drawing Sheets

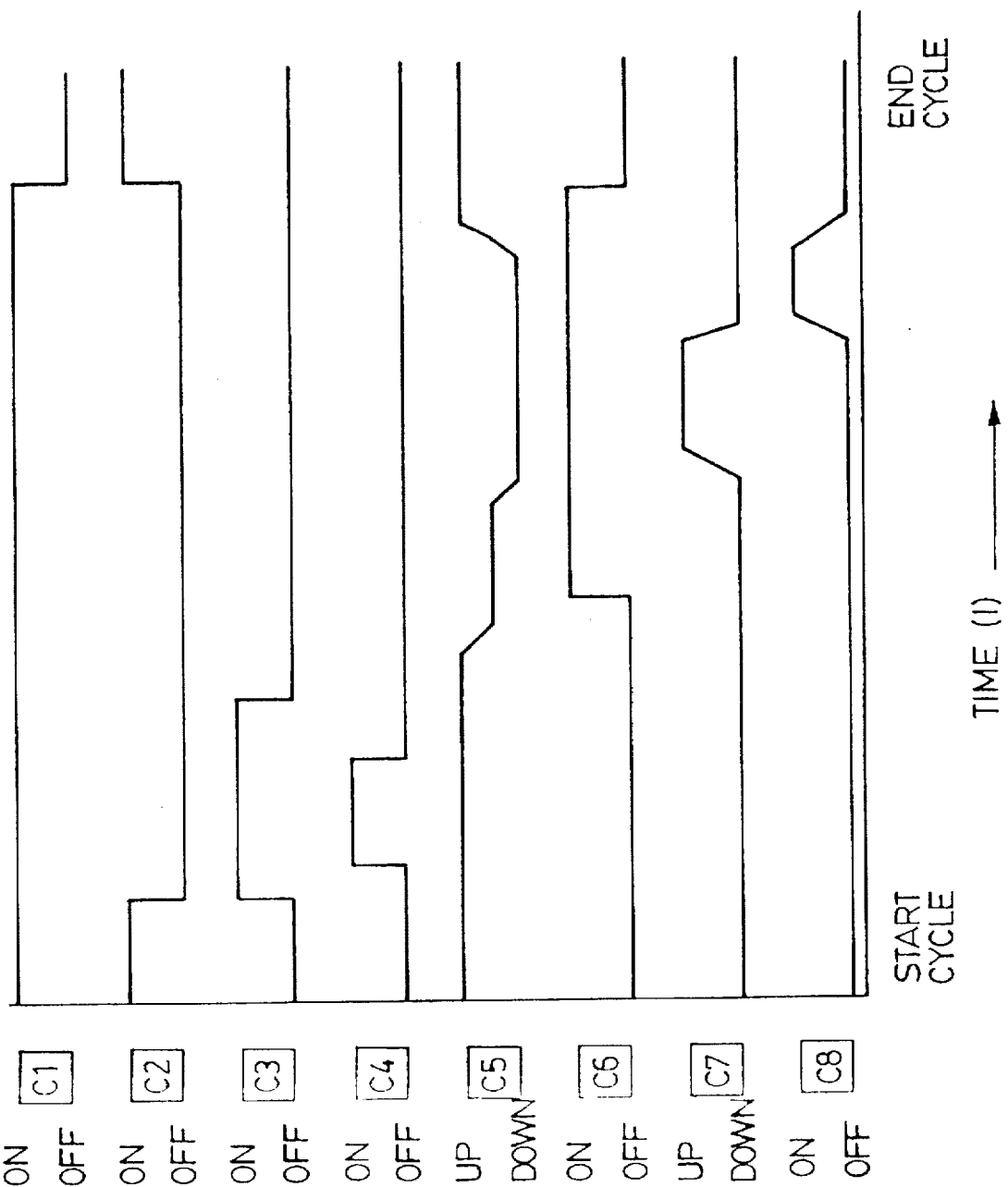

INERT ATMOSPHERE SOLDERING APPARATUS

FIELD OF THE INVENTION

This invention relates to a soldering process and apparatus and in particular to an inert atmosphere spot soldering process and apparatus.

BACKGROUND OF THE INVENTION

In my prior U.S. Pat. No. 5,439,158 I disclosed a soldering system having a controlled atmosphere bathing the solder pot and all liquid solder surfaces. In my prior U.S. Pat. No. 5,335,843 I disclosed a spot soldering apparatus which controlled the solder level and immersion of the leads by the meniscus formed by solder in cups in which the terminals were then immersed.

In some situations the terminals to be soldered may be scattered around a printed circuit board and require a multiplicity of cups or pockets properly located to solder a number of terminals substantially simultaneously. At the same time it is desirable that the cups, terminals and solder surfaces be protected by an inert atmosphere as efficiently as possible.

In soldering terminals which are close together bridging may occur; that is adjacent terminals may be unintentionally connected by a solder bridge. A process which reduces this tendency is most desirable.

Flux is normally applied to areas to be soldered and the flux may contain volatiles or moisture which are desirably driven off before the terminals are soldered. The current move to volatile free fluxes makes this particularly important since water is now a common ingredient.

Solder balls are also produced in some processes and any reduction in their formation is desirable.

SUMMARY OF THE INVENTION

In accordance with the present invention a PC board (a printed circuit board) is delivered by a conveyer line to a solder station which is provided with cups arranged to conform to the terminal arrangement, some times referred to as the 'foot print" of the printed circuit. Each cup is arranged to be filled to overflowing with molten solder. An atmosphere of hot inert gas is provided to surround each cup and cover the terminals prior to soldering, preheating the area and driving off moisture and volatiles and minimizing production of solder balls. The atmosphere of hot inert gas is continued after soldering, minimizing oxidation and bridging between terminals.

Also, to minimize bridging, the board is not raised vertically but is tilted as it is raised causing the solder to peel back while it is exposed to the hot inert atmosphere and thus maintained fluid.

A clearer understanding of my invention may be had from a consideration of the following description and drawings in which:

BRIEF DESCRIPTION OF THE DRAWINGS

FIG. 6 is a sequence chart showing the time relationship of the various steps of the process.

DESCRIPTION OF THE PREFERRED EMBODIMENT

Figure 1:
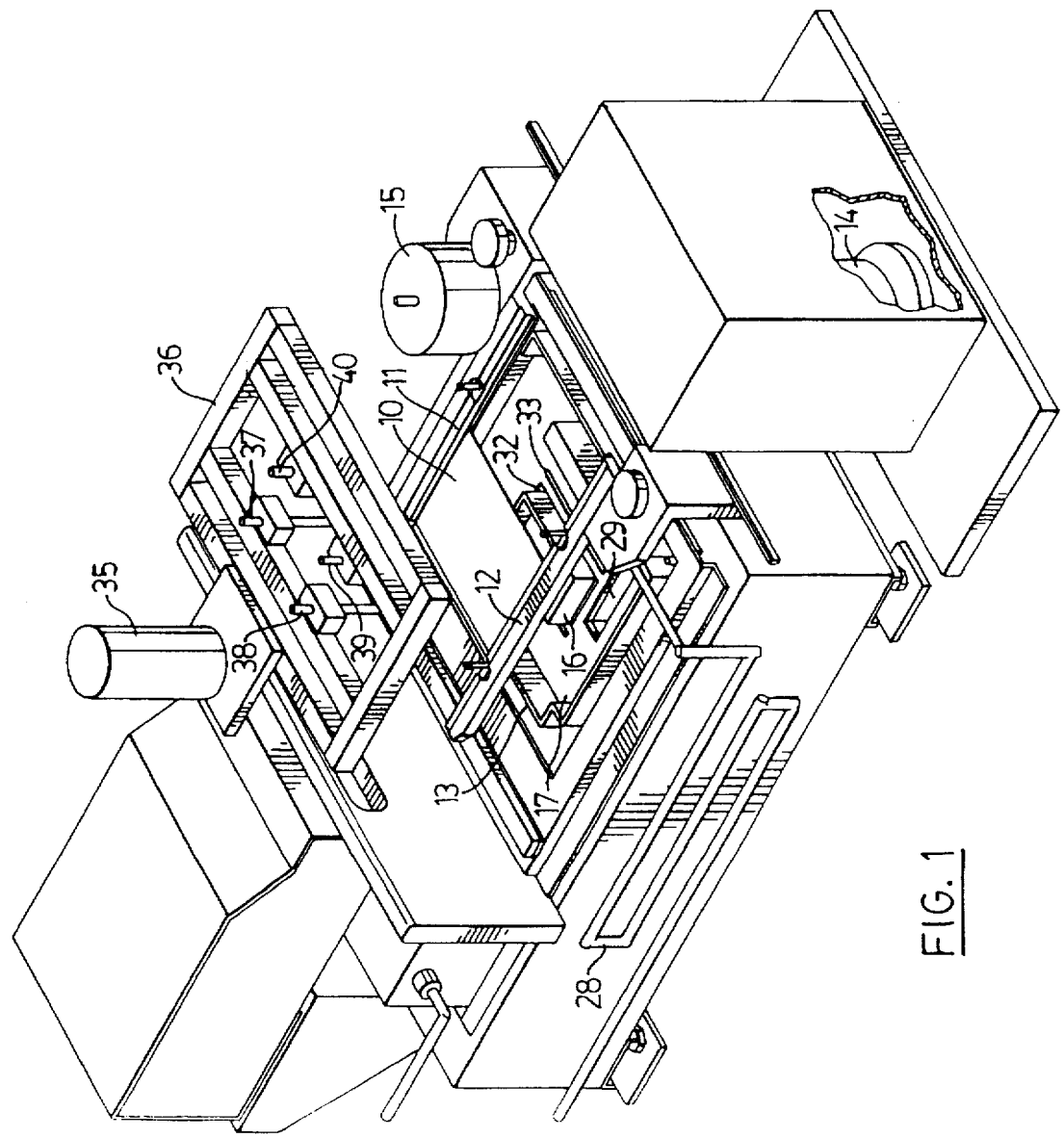
FIG. 1 is an isometric view of a solder station in a soldering system in accordance with my invention.
Figure 2:
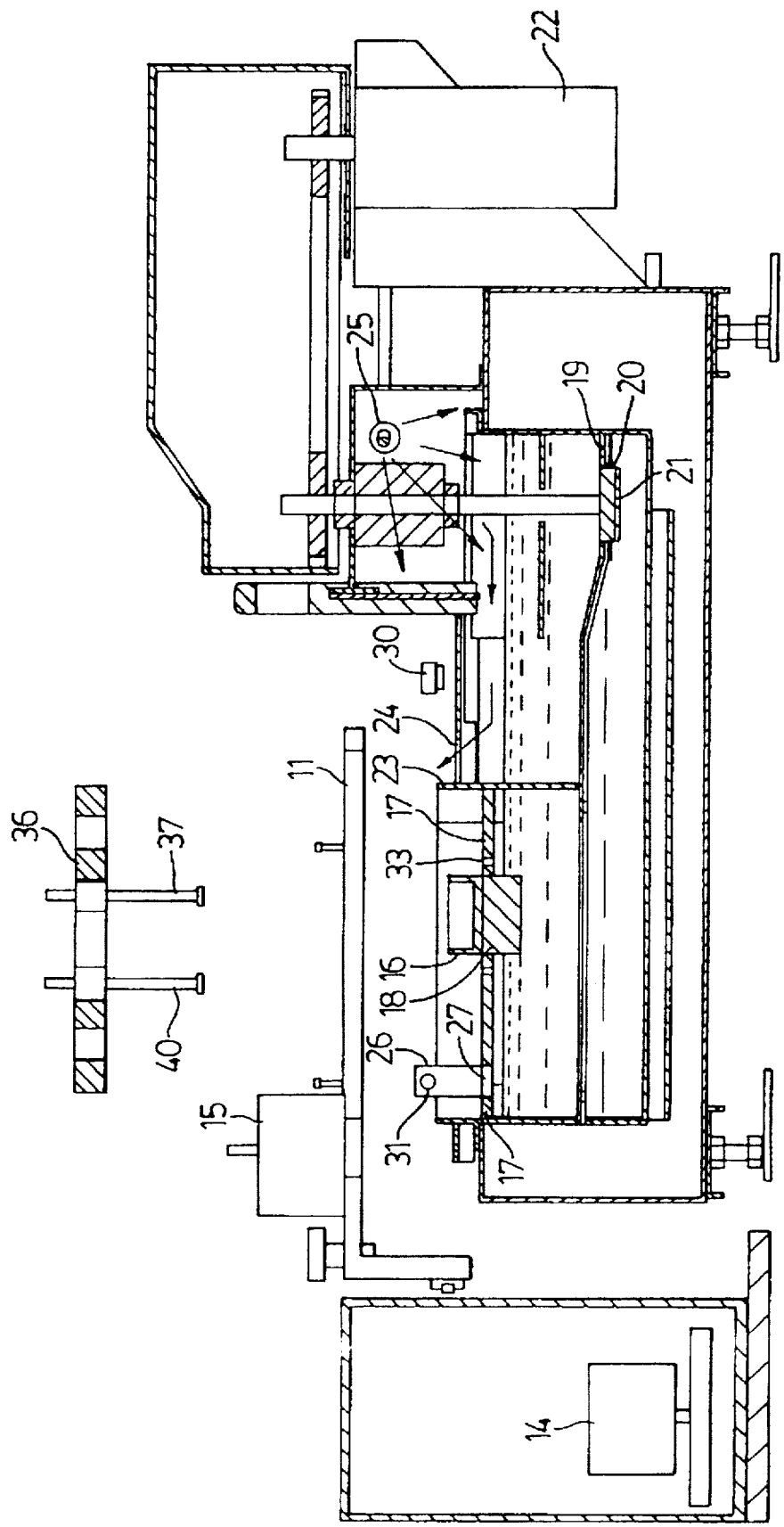
FIG. 2 is a sectional view of the solder station of FIG. 1 at the first step of the the process.

Considering FIGS. 1 and 2, FIG. 1 shows, in projection, and FIG. 2 shows, partly in section, the various elements of a solder station in accordance with my invention. The station is intended to be included in a soldering line of the same general type as the one illustrated in U.S. Pat. No. 5,439,158. The PC (printed circuit) board 10 to be soldered is delivered to the solder station by any suitable conveyer system and held in place on rails 11 and 12 when properly located over solder pot 13. The vertical position of rails 11 and 12 is adjustable by stepper motors 14 and 15. Stepper motor 14 raises and lowers the rails 11 and 12 relative to the solder pot while stepper motor 15 tilts the rails 11 and 12 relative to the solder pot 13.

Within the solder pot are a number of solder pockets such as pocket 16 arranged to coincide with the location of the leads on the PC board which are to be soldered. These pockets are mounted in a solder plate 17 which is removably mounted in the solder pot 13 and each pocket includes a heat sink 18 (shown in FIG. 2) thermally connected to the pocket and constantly immersed in the solder.

As more clearly shown in FIG. 2 the solder pot 13 is divided into a number of chambers. A horizontal wall 19 separates the lower portion of the right hand side of the solder pot 13 from the upper portion and includes an opening 20 in which the impeller 21 of a pump is located. The pump includes the necessary shaft, bearings, gas seal, drive gear etc. to connect it to the pump drive motor 22. A vertical wall 23 separates the left hand upper portion of the solder pot from the right hand upper portion of the solder pot and is joined to the horizontal wall 19. The upper left hand portion of the solder pot is open to the lower left hand portion and an orifice 29 is provided through the solder plate 17 to permit solder to flow between the lower and upper left hand portion of the solder pot 13.

The right hand upper portion of the solder pot is substantially enclosed, except for opening 24. This enclosed portion, including the solder surface and the pump, is supplied through a control (not shown) with an inert atmosphere such as nitrogen, carbon dioxide, argon etc. through a diffuser 25 from a suitable source of compressed gas.

A similar supply of inert gas is provided through sintered metal diffuser 31 to a header 26 sealed to an orifice 27 in the solder plate from a further control (not shown) through tubing 28 (see FIG. 1) which is clamped to the outer wall of the solder pot 13.

A hold down frame 36, the function of which will be described subsequently, is movable by motor 35 to cause the spring mounted pins 37, 38, 39, and 40 to engage the PC board.

OPERATION

Figure 5:
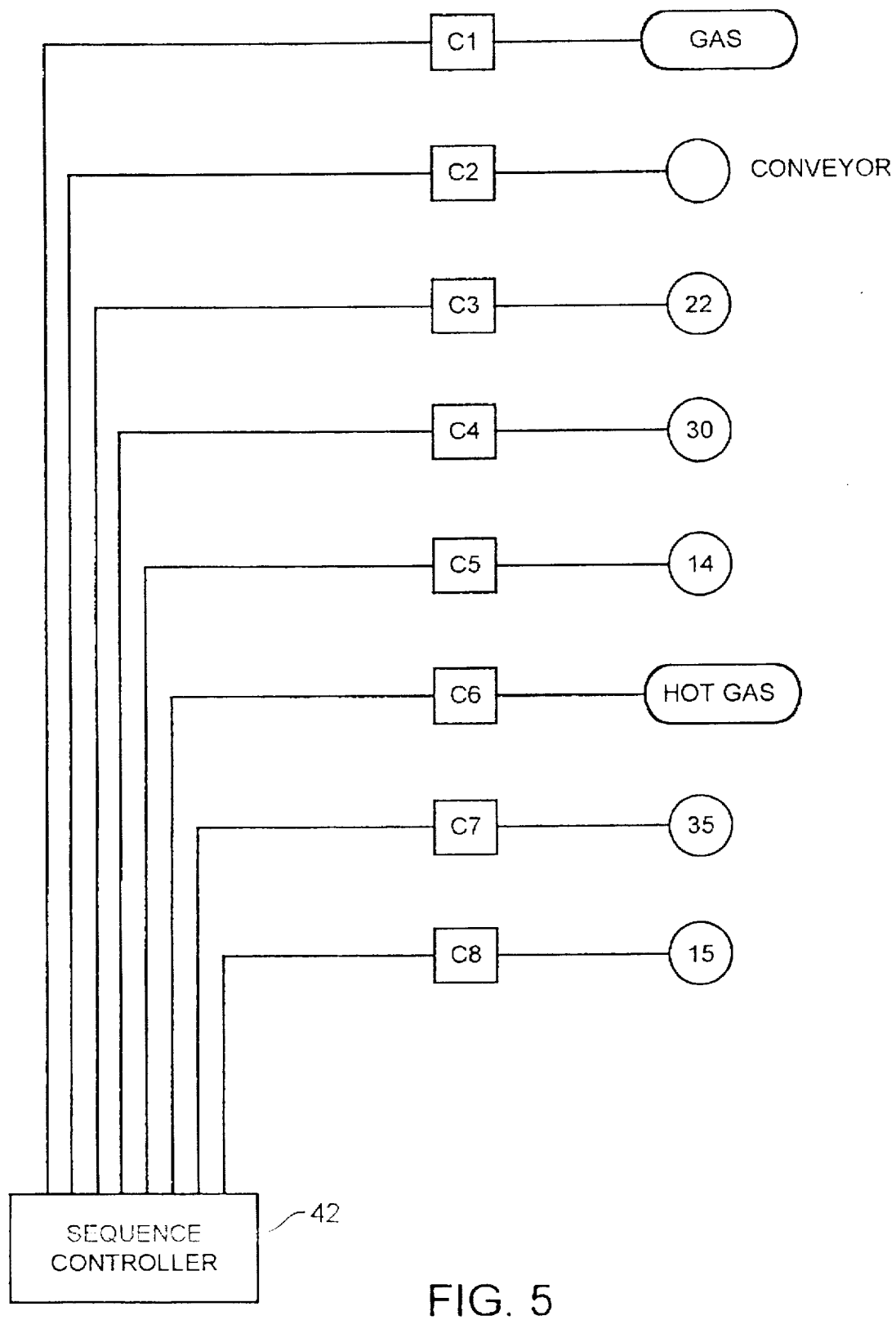
FIG. 5 is a simplified schematic diagram of the control system for the various motors of the system.

FIG. 5 is simple schematic functional diagram showing eight controllers designate C1–C8, their associated motors 14, 15, 22, 30 and 35, one gas control for inert gas as supplied to diffuser 25, a second gas control for hot inert gas supplied to diffuser 31 and a motor associated with the conveyer system. All the controllers C1–C8 are controlled by the sequence controller 42 and timed as illustrated in the sequence chart of FIG. 6.

The solder pot 13 is filled with molten solder maintained at the desired temperature by the usual heat control system. Controller C1 is turned on providing a flow of inert gas to diffuser 25 and flooding this portion of the solder pot 13 with inert gas.

Figure 3:
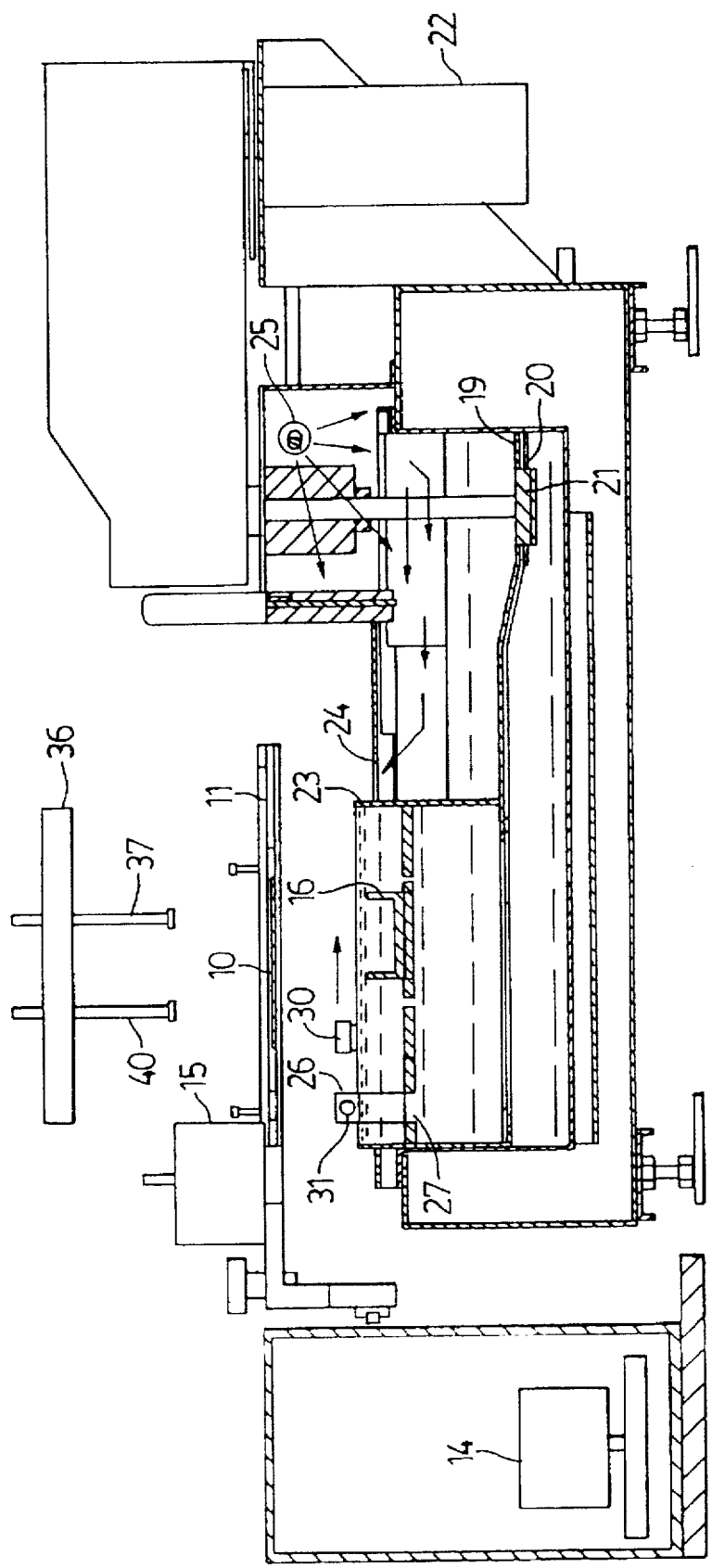
FIG. 3 is a sectional view of the solder station of FIG. 1 at the next step of the process.

Controller C2 is turned on until the PC board 10 is delivered to the solder station by the conveyer system (not shown) and, when it is properly located over the solder plate 17, received on the rails 11 and 12 and controller C2 is turned off. Controller C3 is turned on, pump motor 22 is energized and the impeller 21 forces the solder down out of the upper right hand portion of the solder pot and up through orifice 29 in the solder plate 17 until solder over flows wall 23 back into the upper right hand portion of the solder pot through opening 24 (see FIG. 3). Controller C4 is turned on operating wiper 30, which, having previously located in its left hand position, is now swept back to its right hand position across the surface of the solder to remove any dross which is dumped back into the solder pot through opening 24. Controller C4 is now turned off and the wiper returned to its rest position. Such wipers are well known in the art and no description of the structure or mechanization of such a wiper is deemed necessary.

Figure 4:
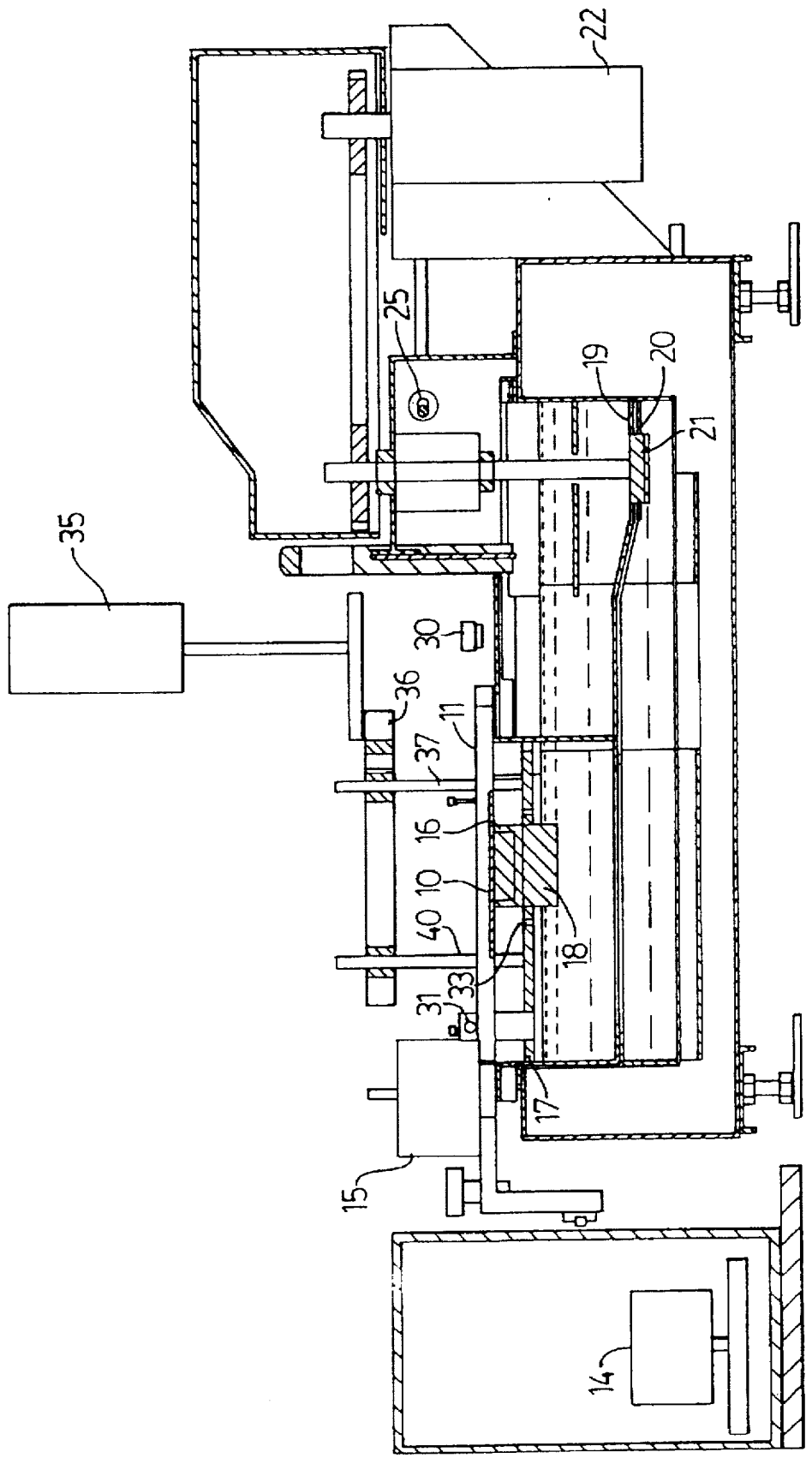
FIG. 4 is a sectional view of the solder station of FIG. 1 at the third step of the process.

Controller C3 is now turned off, pump motor 22 is stopped and the solder retreats into the upper right hand portion of the solder pot 13 leaving a space between the solder plate 17 and the solder surface. (see FIG. 4) The pocket 16 has now been filled to overflowing and the precise level of the solder in the pocket is established by the meniscus formed by the molten solder. The solder in the pocket is maintained at the proper temperature by the associated heat sink 18. Controller C5 is now turned on energizing stepping motor 14 until the PC board is lowered to position "down 1" about 1 cm. above the pocket 16.

Controller C6 is activated causing inert gas to be supplied through tube 28 to sintered metal diffuser 31 through header 26 down through orifice 27 under solder plate 17 and up though orifices 32 and 33 around pocket 16. This gas is preheated when it passes through tube 28 to a temperature approaching that of the molten solder and preheats the terminals and drives off any volatile materials prior to the soldering process and also helps to maintain the solder in the pocket at the correct temperature.

Controller C5 is activated, motor 15 is again energized lowering the rails 11 and 12 to position "down 2" where the PC board 10 is located at a precise level in relation to the pocket 16 and the terminals to be soldered are immersed to the desired depth in the solder.

Controller C7 is activated and hold down motor 35 is energized lowering the hold down frame 36 causing the spring loaded pins 37, 38, 39 and 40 to press against the PC board and hold it flat against the rails 11 and 12 to correct any bowing of the board, which frequently occurs in the reflowing process which precedes spot soldering.

When the immersion time is complete and the terminals have been properly soldered the controller C7 is again activated, hold down motor 35 is energized in reverse raising the hold down frame 36.

Controller C8 is activated, motor 15 is energized causing rails 11 and 12 to tilt gradually and lift one end of the PC board causing the solder to peel back from the board. Controller C5 is reactivated, motor 14 is now energized in reverse to cause the rails 11 and 12 to rise vertically while controller C8 is reactivated and motor 15 is reversed. The PC board resumes its horizontal position and rises to its initial position where it once more may be advanced by the conveyer system. Controller C1 is deactivated and gas flow to diffuser 25 is terminated and the cycle is complete, ready for the next board to be presented.

While the apparatus has been shown in some detail it will be understood that numerous variations of the structures could be arranged to function in a substantially similar manner. The exact apparatus would depend upon the nature of the device being soldered. For example, while it has been described as designed to spot solder terminals on a PC board, it could be designed to spot solder any arrangement of terminals or devices which require precise, automated soldering. The provision of a hot inert atmosphere primarily around the elements being soldered and the sequencing of the various steps of the process can clearly have other applications.

While tubing 28 has been shown as connected to the solder pot it is also possible that this tubing be immersed in the solder thus maintaining the inert gas at liquid solder temperature.

It will also be understood that while the apparatus and process have been described as a soldering process the equipment may also be used in a desoldering process where it is desired to remove one or more elements from a previously soldered board. It is only necessary to conform the pockets to the desired foot print and only the terminals of the element to be removed will be immersed in solder. The element may then be removed without damage to adjacent elements.

I claim:

1. A process for dip spot soldering of terminals which project below the bottom surface of a device which also includes heat sensitive components on the same surface by immersion of said terminals in liquid solder contained in cups arranged to correspond to the location of said terminals comprising:

exposing said device to a flow of hot inert gas emitted from orifices around the periphery of said cups until virtually all volatile fluids in the vicinity of said terminals are evaporated and the terminals heated to almost soldering temperature;

lowering said device to the touch the surface of the liquid solder in said cups thus immersing said terminals in liquid solder and retaining the device there until the terminals are properly wetted by the solder;

raising said device gradually from the surface of said liquid solder until the terminals are above the surface of the solder while continuing to expose the terminals to the flow of hot inert gas;

terminating the flow of hot inert gas and permitting the solder on said terminals to solidify.

2. A soldering process as claimed in claim 1 wherein said said device, as it is raised from the surface of the solder, is raised gently at one of its ends gradually lifting the terminals out of the solder causing the solder to peal back from the surface of the device and the inert gas to flow across the surface of the solder and then raised at the other of its ends until it is parallel to the surface of the liquid solder.

3. A process as claimed in claim 1 wherein said device is moved to a first position directly above said liquid solder then lowered to a second position where said terminals are only slightly above the level of the liquid solder, then lowered to a third position where said terminals are immersed in said liquid solder, then raised to its first position.

4. A process as claimed in claim 3 wherein supply of said heated inert gas is commenced only when said device is lowered to said second position, said device is maintained in said second position until any volatile liquid in the vicinity of said terminals are substantially evaporated, and supply of said heated inert gas is terminated after said device is moved to its first position.

5. A process for dip spot soldering of terminals which project below the bottom surface of a device, which also includes heat sensitive components on the same bottom surface, by immersion of said terminals in liquid solder contained in pockets arranged to correspond to the location of said terminals and filled with liquid solder from a solder pot comprising:

exposing said device to a flow of hot inert gas, which has been heated by conduction from the solder in said solder pot and is emitted from orifices around the periphery of said pockets, until virtually all volatile fluids in the vicinity of said terminals are evaporated and the terminals heated to almost soldering temperature;

lowering said device to the touch the surface of the liquid solder in said pockets thus immersing said terminals in liquid solder and retaining the device there until the terminals are properly wetted by the solder;

raising said device gradually from the surface of said liquid solder until the terminals are above the surface of the solder while continuing to expose the terminals to the flow of hot inert gas;

terminating the flow of hot inert gas and permitting the solder on said terminals to solidify.

6. A soldering process as claimed in claim 5 wherein said device, as it is raised from the surface of the solder, is raised gently at one of its ends gradually lifting the terminals out of the solder causing the solder to peal back from the surface of the device and the inert gas to flow across and between the surface of the liquid solder and the device and then raised at the other of its ends until it is parallel to the surface of the liquid solder.

7. A process as claimed in claim 5 wherein said device is moved to a first position with the terminals directly above said liquid solder in said pockets then lowered to a second position where said terminals are only slightly above the level of the liquid solder, then lowered to a third position where said terminals are immersed in said liquid solder, then raised to its first position.

8. A process as claimed in claim 7 wherein supply of said heated inert gas is commenced only when said device is lowered to said second position, said device is maintained in said second position until any volatile liquids in the vicinity of said terminals are substantially evaporated, after the device is lowered to said third position it is again raised to said second position and supply of said heated inert gas is terminated only after said device is returned to its first position.

* * * * *